US 6,579,579 B2

(12) United States Patent
Hodel et al.

(10) Patent No.: US 6,579,579 B2
(45) Date of Patent: Jun. 17, 2003

(54) CONTAINER MADE OF A LIGHT METAL ALLOY AND PROCESS FOR ITS MANUFACTURE

(75) Inventors: Ulf Hodel, Engen (DE); Reinhold Gitter, Gottmadingen (DE)

(73) Assignee: Alcan Technology & Management Ltd., Neuhausen am Rheinfall (CH)

( * ) Notice: Subject to any disclaimer, the term of this patent is extended or adjusted under 35 U.S.C. 154(b) by 0 days.

(21) Appl. No.: 10/012,794

(22) Filed: Dec. 7, 2001

(65) Prior Publication Data

US 2002/0086177 A1 Jul. 4, 2002

(30) Foreign Application Priority Data

Dec. 29, 2000 (DE) .......................... 100 65 264
Feb. 15, 2001 (DE) .......................... 101 06 999

(51) Int. Cl.$^7$ ..................... B65D 1/00; B21D 31/00
(52) U.S. Cl. ................ 428/34.1; 72/367.1; 72/368; 72/700; 220/62; 220/917; 428/577; 428/600; 428/602; 428/469
(58) Field of Search .............. 428/34.1, 577, 428/600, 602, 469; 420/542, 546; 72/264, 268, 367.1, 368, 370.01, 370.21, 462, 700, 715; 220/62, 917

(56) References Cited

U.S. PATENT DOCUMENTS

| 3,874,213 A | * | 4/1975 | Sperry et al. ................. 72/700 |
| 5,738,752 A | | 4/1998 | Kadomura ................... 156/345 |
| 5,811,195 A | * | 9/1998 | Bercaw et al. .............. 428/469 |
| 6,027,629 A | | 2/2000 | Hisamoto et al. ............. 205/50 |
| 6,056,836 A | | 5/2000 | Hoffman et al. ............ 148/437 |

FOREIGN PATENT DOCUMENTS

EP          594 509 A1     4/1994

* cited by examiner

Primary Examiner—Robert R. Koehler
(74) Attorney, Agent, or Firm—Ostrolenk, Faber, Gerb & Soffen

(57) ABSTRACT

A container, in particular a container with a tube-shaped wall, made of a light metal alloy for use as a reaction chamber in a process for manufacturing wafers. The container wall is made by way of extrusion or ring-rolling, and the container wall is made from a metallic, aluminum-based material with a magnesium content between 1.2 and 2.0 wt. %. The elements Cu, Fe, Si are present in amounts less than 0.5 wt. %. This container wall may also be shaped in one piece as container with a base plate.

4 Claims, 1 Drawing Sheet

CONTAINER MADE OF A LIGHT METAL ALLOY AND PROCESS FOR ITS MANUFACTURE

BACKGROUND OF THE INVENTION

The invention relates to a container, in particular a container with a tube-shaped wall made of a light metal alloy, for use as a reaction chamber in a process for manufacturing wafers, in particular for use in wafer-etching processes. The invention also relates to a process for its manufacture.

Such containers of a light metal alloy are known as inner containers for process containers for the treatment of wafers, in particular for performing wafer-etching processes.

Wafers are thin, oblate like discs less than 0.5 mm thick, which are cut out of single crystals of doped silicon or other semiconductor materials in order to be used for integrated printed circuits or the like electrical components. After removing ultra thin discs from a silicon ingot, these discs are lapped, etched and polished for wafer manufacture.

In contrast to lapping—in which rotating upper and underlying pads are used along with a crystalline granulate emulsion to remove material from the interlying silicon disc—a grinding process removes larger amounts of material and achieves better surface quality; at the same time, the depth of damage to the crystal surface is less. By employing special grinding wheels and process parameters it is possible to create, high pressure and temperatures locally i.e. at the surface being worked and thus to plasticise the silicon; silicon fragments can be removed at the surface without causing the material to fracture.

Up to now, metal containers made from seamless tubes extruded over a mandrel have been employed for processing wafers of normal size i.e. 200 mm diameter. At a maximum tube diameter of about 450 mm this manner of producing the containers from an AlMg alloy containing about 4 wt. % Mg—i.e. an alloy with a high Mg content for adequate hardness—is expensive. The inner surface is normally anodised. In spite of this the alloying elements have an effect on the wafer manufacturing process, in particular when, depending on the etching medium, defects are produced in the anodic layer or increase due to the attack of gases. Further, with increasing diameter of wafer, it is no longer possible to produce the desired design of container using the normal mandrel tool.

SUMMARY OF THE INVENTION

In view of the above the object of the present invention is to improve the ease of manufacture of such metal containers and to increase their service life.

In accordance with the invention the container wall is manufactured from a metallic material by extrusion, whereby the material employed has aluminum as its basis and a magnesium content between 1.2 and 2.0 wt. % along with an extremely low concentration of Cu, Fe, Si—approximately of the order of magnitude of impurities, i.e., less than 0.5%.

To advantage, for production of the tube, use is made of a cost-favourable special die, however,—instead of the AlMgSi alloy traditionally used with special dies—along with a new alloy for this purpose viz., the above mentioned $AlMg_x$ the fraction "X" of which, as said, lies between 1.2 and 2.0 wt. % and in particular contains no significant amount of Si, Cu or Fe.

Also within the scope of the invention is a container the wall of which along with a base plate is in the form of a single piece made from the above mentioned aluminum based material with a magnesium content between 1.2 and 2.0 wt. %.

By dispensing with a silicon content e.g. of 0.8 wt. % in the new processing a special die there is no longer the hardening effect which is to be expected by coagulation of intermetallic phases. Instead, an alternative hardening effect is achieved in that the magnesium content is increased. The prejudice prevalent among experts in the field viz., that large tubes can be produced only via a die when Mg and Si are present in the alloy was not found to hold.

A further possibility for manufacturing according to the invention is ring-type rolling of the container wall.

The result is that a tube with adequate weldability can be produced and has adequate strength for production of the container and for the described application, but does not contain Fe and Si which have an adverse effect on the wafer manufacture.

BRIEF DESCRIPTION OF THE DRAWINGS

Further advantages, features and details of the invention are described in the following description of an exemplified embodiment and with the aid of the drawing which shows schematically in.

DETAILED DESCRIPTION OF THE PREFERRED EMBODIMENTS

Figure 1:
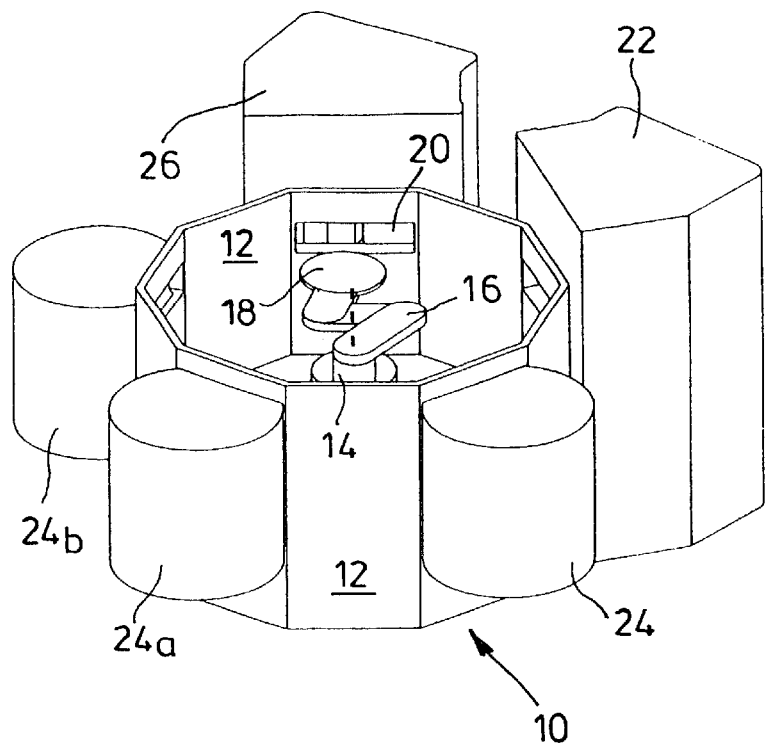
FIG. 1 a plan view of a station for wafer production.
Figure 2:
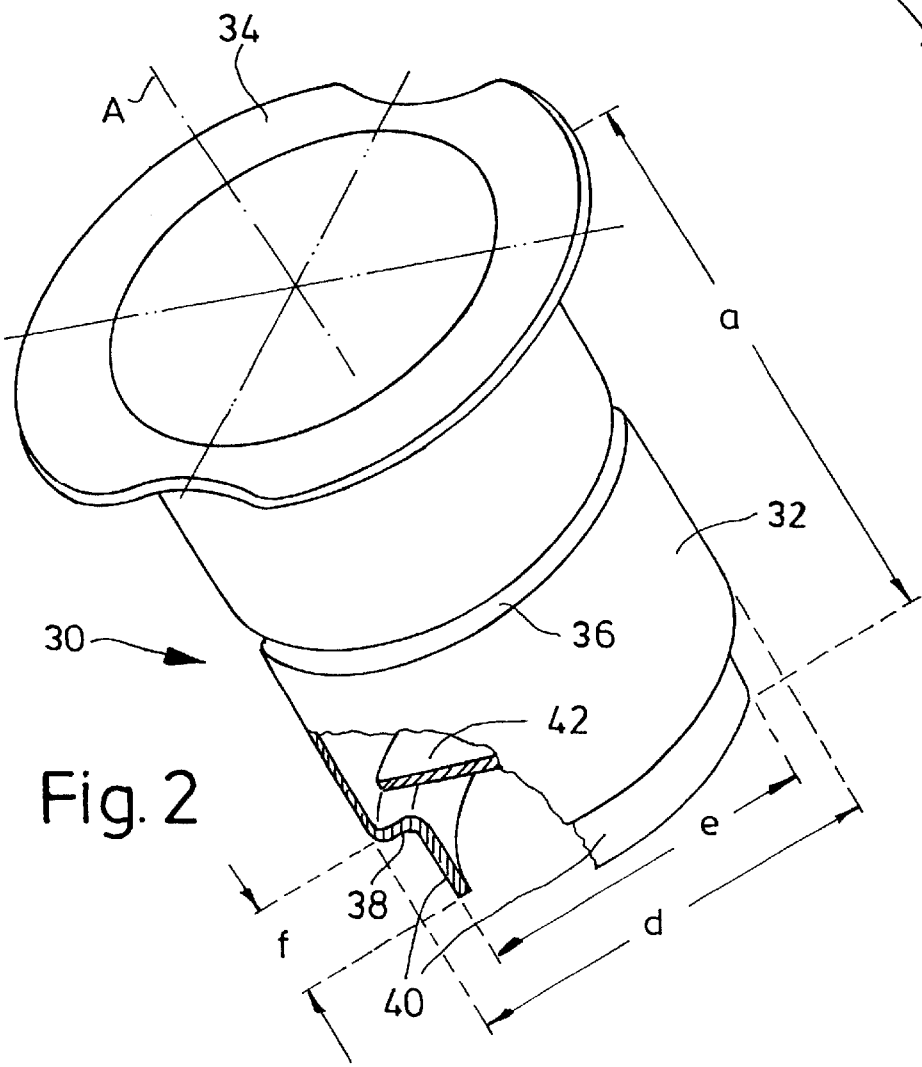
FIG. 2 a perspective view of a, partly sectioned, inner container for a process container—not shown here—for processing wafers, in particular for the wafer etching process.

FIG. 1 shows a container 10 for processing wafers; the container is polygonal in cross-section—here with ten wall sections 12—and a supporting arm made up of several hinged arm lengths 16, mounted on a central shaft 14, for a supporting disc 18 for a wafer which is not shown here. The wafer is taken from a slit 20 in the wall leading to a source 22, subjected to etching and cleaning in processing stations 24, 24a, 24b then passed on to a receiving station 26.

Also required for this is the above mentioned processing container, the inner container 30 of which features an integral radial collar 34 as supporting element at one end of a cylindrical body in the form of a container wall 32 of outer diameter "d" e.g. of 450 mm; in another version the wall 32 may also be polygonal in cross-section. The body or container wall 32 exhibits a ring-shaped groove 36 at about the middle of a line of half length "a" running parallel to the axis A, and at the end remote from the radial collar 34 a ring-shaped step 38 leading to a likewise integral ring 40 of outer diameter "e" which here is 400 mm in size. The length "f" of the ring 40 is equal to slightly more than one sixth of that length "a" of the overall body 32. A base plate 42 is indicated on the radial step 38.

Not shown is a version with an integral base plate 42 on the container wall or body 32.

The inner container 30 is shaped out of an $AlMg_x$ alloy, where the fraction X lies between 1.2 and 2.0 wt. %. This alloy contains the elements Cu, Fe, Si, if at all then in amounts of the order of magnitude of impurities.

What is claimed is:

1. A ring-rolled container made of light metal alloy for use as a reaction chamber in a process for manufacturing wafers, the container comprising a ring-rolled container wall from a metallic, aluminum-based material with a magnesium content between 1.2 and 2.0 wt. %, whereby Cu, Fe, Si are present in amounts less than 0.5 wt. %.

2. A container according to claim 1, wherein the wall is tube-shaped.

3. A container according to claim 1, wherein the container wall is shaped in one piece as a container body with a base plate.

4. A process for manufacturing a container made of a light metal alloy for use as a reaction chamber for manufacturing wafers, the container comprising a container wall, the process comprising the step of ring-rolling the container wall from a metallic, aluminum-based material with a magnesium content between 1.2 and 2.0 wt. %, whereby elements Cu, Fe, Si are present in amounts less than 0.5 wt. %.

* * * * *